United States Patent [19]
Richter

[11] Patent Number: 6,118,252
[45] Date of Patent: Sep. 12, 2000

[54] PROCESS FOR DETERMINING THE STARTING CAPACITY OF THE STARTER BATTERY OF A MOTOR VEHICLE

[75] Inventor: Gerolf Richter, Hildesheim, Germany

[73] Assignee: VB Autobatterie GmbH, Hannover, Germany

[21] Appl. No.: 09/190,900

[22] Filed: Nov. 12, 1998

[30] Foreign Application Priority Data

Nov. 13, 1997 [DE] Germany .......................... 197 50 309

[51] Int. Cl.⁷ .............................. H02J 7/00; G01R 31/36
[52] U.S. Cl. ......................... 320/132; 324/427; 340/636
[58] Field of Search .................................. 320/132, 149, 320/150, 151, 152, 153, DIG. 21; 324/427, 429; 340/636

[56] References Cited

U.S. PATENT DOCUMENTS

| | | | |
|---|---|---|---|
| 4,888,716 | 12/1989 | Ueno | 324/429 |
| 4,994,728 | 2/1991 | Sasaki | 320/DIG. 21 |
| 5,936,383 | 8/1999 | Ng et al. | 320/DIG. 21 |

FOREIGN PATENT DOCUMENTS

| | | |
|---|---|---|
| 27 30 258 A1 | 1/1978 | Germany . |
| 37 12 629 C2 | 10/1992 | Germany . |
| 39 01 680 C2 | 5/1993 | Germany . |

*Primary Examiner*—Peter S. Wong
*Assistant Examiner*—Pia Tibbits
*Attorney, Agent, or Firm*—Schnader Harrison Segal & Lewis LLP

[57] ABSTRACT

The invention relates to a process for determining the starting capacity of a starter battery of a motor vehicle for which the mean value for the voltage surge during the starting of an internal combustion engine, is determined as a function of mean values for the battery and engine temperatures, compared with the voltage surge values of a characteristic line field which records determined voltage surges as a function of corresponding battery and engine temperatures, a deviation of the actually determined voltage surge from the voltage surge stored in the characteristic line field is determined and compared to a preassigned value, and an indicator or an alarm is triggered as soon as the preassigned value is exceeded.

12 Claims, 2 Drawing Sheets

PROCESS FOR DETERMINING THE STARTING CAPACITY OF THE STARTER BATTERY OF A MOTOR VEHICLE

BACKGROUND OF THE INVENTION

1. Field of the Invention

The invention relates to a process for determining the starting capacity of the starter battery of a motor vehicle.

2. Description of the Related Art

To enable a starter battery to start a motor vehicle with an internal combustion engine, the state of charge and the degree of aging or the characteristic capacity loss are decisive, since the current intensity that can be taken from the starter battery and the power given off is limited by these factors.

In a modem motor vehicle, the properties of the generator, battery, and electricity-using devices are technically matched to one another in such a way that only in the case of massive malfunction can such a low battery charge state occur that the starting capacity or other functions are no longer assured. Therefore, the question of a reliable indicator for replacing the battery is of great interest. Especially if electricity-using devices that are relevant for safety such as electric brakes or electrically supported steering aids are installed, the knowledge of the predicted end of useful battery life is very important.

From German patent DE-C 3901680, a process for monitoring the cold starting capacity of a starter battery for an internal combustion engine is known in which the time curve of the voltage drop occurring during starting is observed and evaluated. The evaluation is performed on the basis of the limiting values of a characteristic line obtained by experience and as a function of the battery temperature.

Also known from German patent DE-A 2730258 is a device for indicating the state of charge of a vehicle battery which, in addition to the battery voltage and at least one other battery parameter, registers the engine temperature and gives a warning indication if the reading drops below a preassigned limit.

German patent DE-C 3712629 discloses a measuring device for the remaining service life of a motor vehicle battery which registers the battery voltage and the corresponding load current before and after the first starting process in the fully charged state of the battery, determines the temperaturecompensated internal resistance, registers it in a memory, and compares it with the internal resistances determined during later starting processes of the internal combustion engine. The indication is then given as a function of the preassigned stored threshold values.

SUMMARY OF THE INVENTION

The purpose of the invention is to devise a process which better registers the specific properties of the starter battery used and therefore enables a more accurate statement concerning the end point of usefulness. In one embodiment, the present invention is a process for determining starting capacity of a starter battery of a motor vehicle, comprising the steps of (a) measuring a voltage surge during a starting process of the motor vehicle; (b) comparing the measured voltage surge with characteristic voltage values of a characteristic line field comprising a mean value of voltage surges measured during the starting process and a corresponding battery temperature and engine temperature; (c) finding a deviation of the measured voltage surge from a characteristic voltage surge in the characteristic line field; and (d) triggering an indicator or alarm function when the deviation exceeds a preassigned value. In possible implementations:

- Each mean value of the voltage surges and its corresponding engine temperature and battery temperature are stored in a memory over a defined new battery phase of about 6 to about 18 months;
- The characteristic voltage values are smoothed or supplemented by interpolation or extrapolation procedures;
- A rest voltage is measured before the starting process and compared with a rest voltage in the new battery phase; and/or
- The deviation is indicated as in a fuel gauge on which corresponding permitted values are marked.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
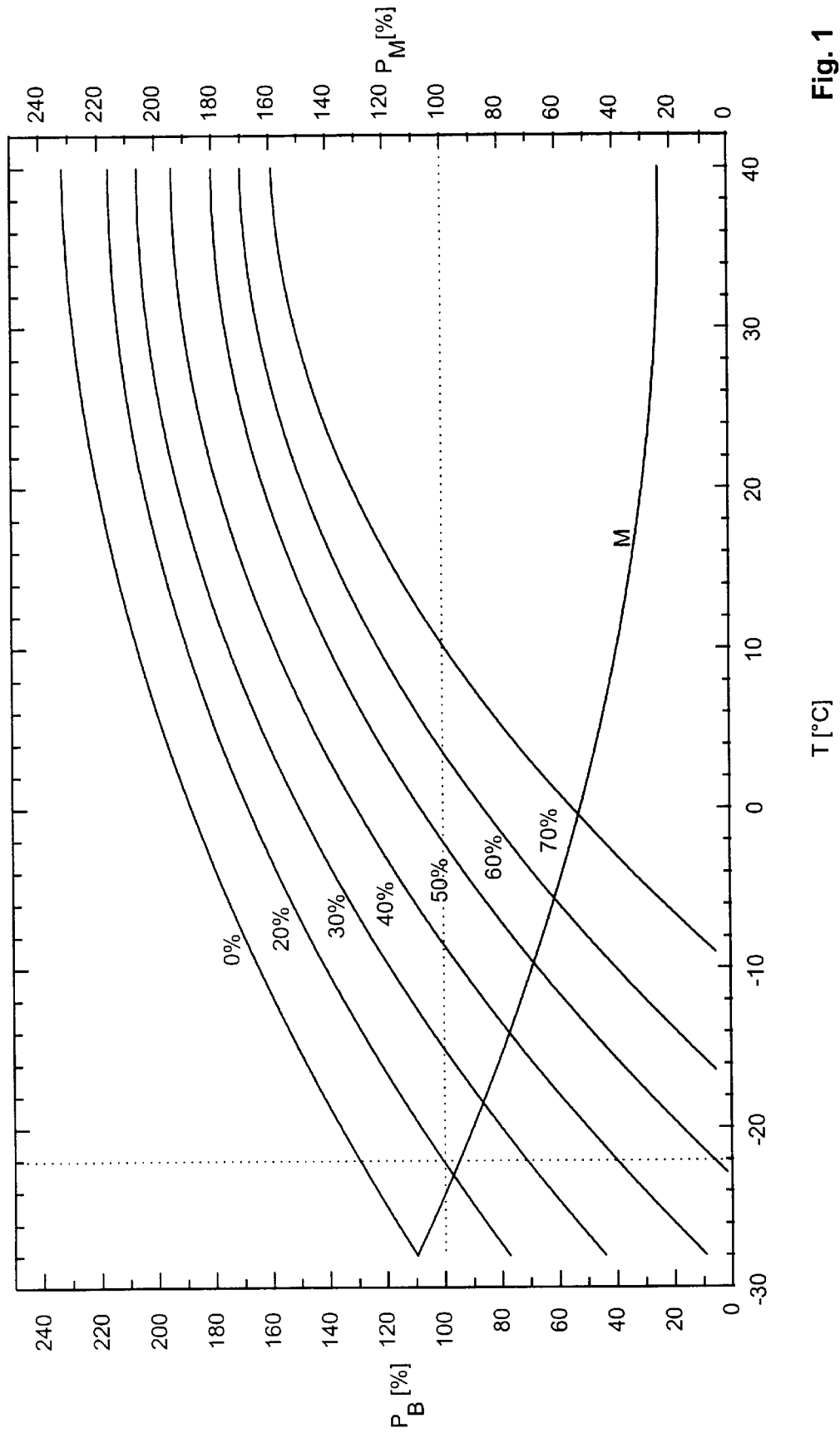
FIG. 1 shows graphical representations of the starting power and various battery discharge curves as a function of engine temperature.

The present invention envisions a direct process for evaluating the ability of the probably most important function of a vehicle battery—the ability to start the internal combustion engine. The process is adapted to the vehicle with its engine and the battery used in each case so that it is unnecessary to provide data and characteristic lines. Upon each start of the internal combustion engine, the voltage surge on the battery terminal $\Delta U_B$ and the motor coolant temperature as well as the battery electrolyte temperature ($T_M$ and $T_B$) are measured. As is known, the power for starting an internal combustion engine depends strongly on the coolant and oil temperatures. With decreasing engine temperature $T_M$, the required starting power $P_M$ increases disproportionately because of the intensified sticking and sliding friction. This behavior of the motor is shown by curve M in FIG. 1. The starting power must be supplied exclusively by the battery of the vehicle, whose power diminishes disproportionately with decreasing temperature. This is also shown in FIG. 1 where the discharge curves designated by 0%, 20%, 30%, 40%, 50%, 60% and 70% indicate the power given off by the battery as a function of the state of charge (100%, 80%, 70%, 60%, 50%, 40% and 30%) as well as the battery temperature. The voltage surge $\Delta U_B$ is then compared against characteristic voltage values. The following describes how the characteristic voltage values are determined. The resistance $R_I$ upon the starting of the internal combustion engine which is the sum of all obstacles to supplying the required starting current is related to the power required for starting the internal combustion engine by the following relationship:

$$P(T_M) = \Delta U_B^2 / R_I(T_B)$$

Figure 2:
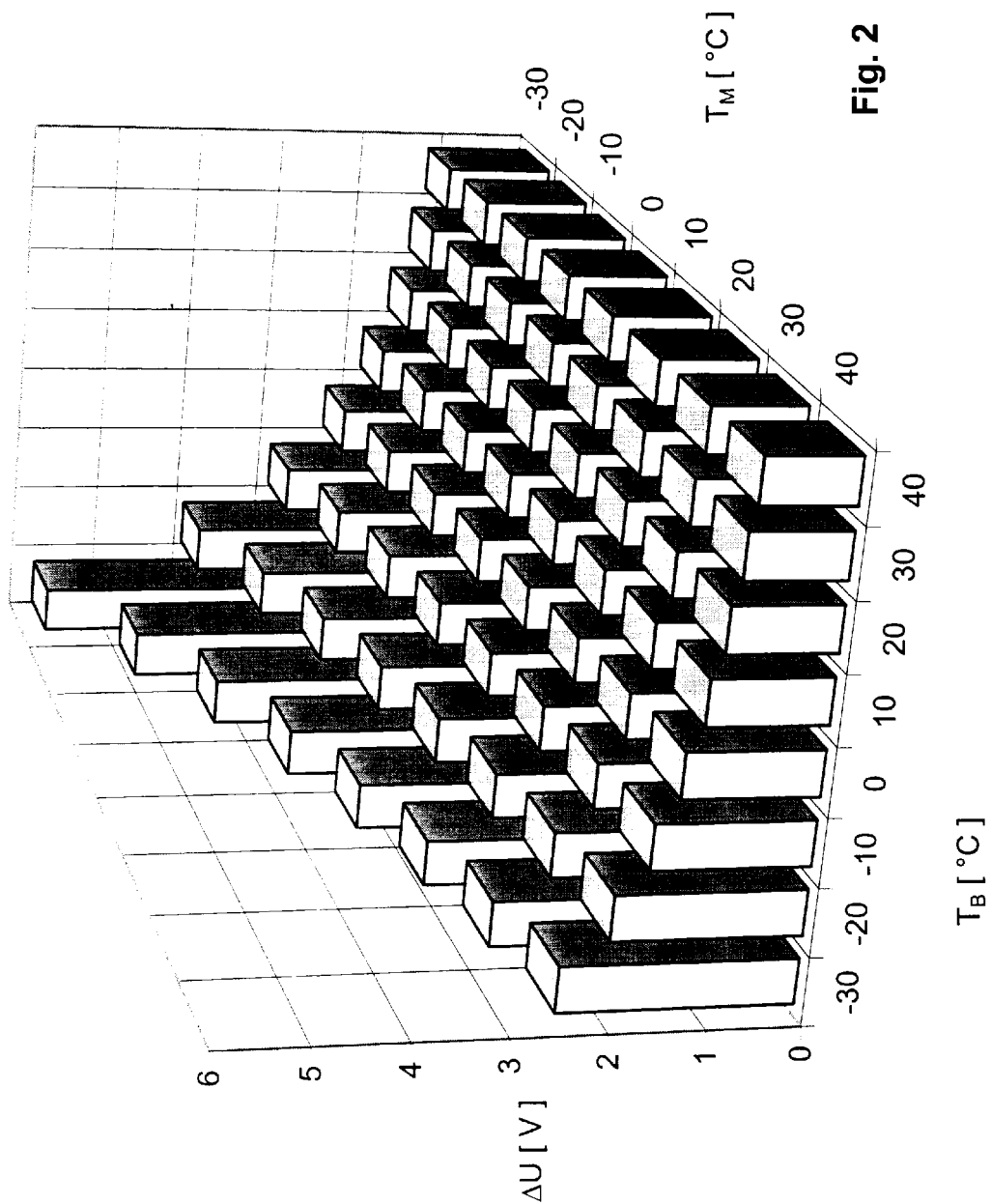
FIG. 2 shows a graphic representation of the voltage surges of the terminal voltage, the motor temperature in each case, and the battery temperature, upon each start in the new phase of a battery.

The anticipated voltage surge upon the starting of an internal combustion engine is derived by the formula $\Delta U_B = \sqrt{P(T_M) R_I(T_B)}$. Since the required starting power at the given temperature for an engine with its secondary mechanisms is approximately constant and the magnitude of the resistance $R_I$ at a given temperature varies as a function of the wear and state of charge of the battery, the deviation E of $\Delta U_B(t)$ after the usage time (t) compared to the voltage surge in the case of a new battery ($\Delta U_B(t=0)$) is a measure of the starting power and the age of the battery $E(t)=\Delta U_B(t)-\Delta U_B(t=0)$. The foregoing formulations are provided to show support for one feature of applicant's invention that starting capacity of a starter battery can be obtained by an analysis of voltage surges of the battery, the motor temperature and the battery temperature, which is described in detail herein. Upon each start in the new phase of the battery, the voltage surges of the terminal voltage ($\Delta U_B$), the motor temperature in each case ($T_M$), and the battery temperature ($T_B$) are stored in a memory in a three-dimensional field of characteristic lines as illustrated in FIG. 2. The determined values may be smoothed by means of a regression process and expanded by interpolation and extrapolation. After the conclusion of the new phase, upon each additional start, it queries whether the voltage surge $\Delta U_B(T_M, T_B)$ is greater than the value contained in the memory which was determined at the same temperatures $T_M$ and $T_B$. If the difference exceeds a defined value or limit E, then it is transformed into an indicator or possibly an alarm. As is known, the internal resistance of a battery is dependent not only on temperature but also on the state of charge of the battery. A great difference in the voltage surge ($E>E_{max}$) therefore can be traced not only to a highly advanced aging, but also to an inadequate charge state. Both battery states, however, are equally undesired. To distinguish between these causes, in addition to the voltage surge upon the starting of an internal combustion engine, the rest voltage is also measured immediately before the starting process. If the rest voltage, which has a low temperature dependence, moves above a certain level $U_{omin}$), then a deficient charge is not to be expected. By monitoring the rest voltage, the indicator of the $E_{max}$ value is a reliable indication of the useful life of the vehicle battery.

A special advantage of the process according to the invention is that the process is automatically adapted to the equipment level of the vehicle in question. Thus, through the registered and stored measured values differences in the vehicles in question in terms of their equipment, e.g., automatic transmission, diesel or gasoline engine, different numbers of cylinders, air conditioner, or other important current users are allowed for in the indication of the useful life end of the starter battery.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A process for determining starting capacity of a starter battery of a motor vehicle, comprising the steps of:
    (a) determining a voltage surge of the battery as a function of a measured battery temperature and engine temperature;
    (b) storing the determined voltage surge as a function of the measured battery temperature and measured engine temperature;
    (c) comparing the determined voltage surge with stored characteristic voltage values of a characteristic line field comprising a mean value of voltage surges previously determined during the starting process as a function of corresponding mean values of battery and engine temperatures, wherein said determined voltage surge is compared to a characteristic voltage value previously determined as a function of a battery temperature and an engine temperature corresponding to said stored battery temperature and engine temperature;
    (d) finding a deviation of the determined voltage surge from said characteristic voltage surge in the characteristic line field;
    (e) triggering an indicator or alarm function when the deviation exceeds a preassigned value.

2. The process of claim 1, wherein each mean value of the voltage surges and its corresponding engine temperature and battery temperature are stored in a memory over a defined new battery phase of about 6 to about 18 months.

3. The process of claim 2, wherein the characteristic voltage values are processed.

4. The process of claim 2, wherein a rest voltage of the battery is measured before the starting process and compared with a rest voltage in the new battery phase.

5. The process of claim 2, wherein the deviation is indicated as in a gauge on which corresponding permitted values are marked.

6. The process of claim 1, wherein the characteristic voltage values are processed.

7. The process of claim 6, wherein a rest voltage of the battery is measured before the starting process and compared with a rest voltage in the new battery phase.

8. The process of claim 6, wherein the deviation is indicated as in a gauge on which corresponding permitted values are marked.

9. The process of claim 1, wherein a rest voltage of the battery is measured before the starting process and compared with a rest voltage in the new battery phase.

10. The process of claim 9, wherein the deviation is indicated as in a gauge on which corresponding permitted values are marked.

11. The process of claim 1, wherein the deviation is indicated as in a gauge on which corresponding permitted values are marked.

12. The process of claim 1, wherein:
    each mean value of the voltage surges and its corresponding engine temperature and battery temperature are stored in a memory over a defined new battery phase of about 6 to about 18 months;
    the characteristic voltage values are processed;
    a rest voltage of the battery is measured before the starting process and compared with a rest voltage of the battery, in the new battery phase; and
    the deviation is indicated as in a gauge on which corresponding permitted values are marked.

* * * * *